(12) United States Patent
Truebenbach

(10) Patent No.: US 10,195,746 B2
(45) Date of Patent: Feb. 5, 2019

(54) GRASPING GRIPPER

(71) Applicant: Teradyne, Inc., North Reading, MA (US)

(72) Inventor: Eric L. Truebenbach, Sudbury, MA (US)

(73) Assignee: Teradyne, Inc., North Reading, MA (US)

(*) Notice: Subject to any disclaimer, the term of this patent is extended or adjusted under 35 U.S.C. 154(b) by 149 days.

(21) Appl. No.: 14/864,115

(22) Filed: Sep. 24, 2015

(65) Prior Publication Data
US 2016/0089793 A1 Mar. 31, 2016

Related U.S. Application Data

(60) Provisional application No. 62/056,092, filed on Sep. 26, 2014.

(51) Int. Cl.
G01R 31/28 (2006.01)
B25J 15/06 (2006.01)
B25J 15/10 (2006.01)

(52) U.S. Cl.
CPC ........ *B25J 15/0616* (2013.01); *B25J 15/10* (2013.01); *G01R 31/2834* (2013.01); *G01R 31/2893* (2013.01); *G01R 31/2896* (2013.01)

(58) Field of Classification Search
CPC ... B25J 15/0616; B25J 15/10; G01R 31/2896; G01R 31/2893; G01R 31/2834
USPC .............. 324/750.19, 750.25; 294/185
See application file for complete search history.

(56) References Cited

U.S. PATENT DOCUMENTS

| 4,166,543 | A | 9/1979 | Dahlstrom |
| 4,398,110 | A | 8/1983 | Flinchbaugh et al. |
| 4,678,952 | A | 7/1987 | Peterson et al. |
| 4,744,039 | A | 5/1988 | Suzuki et al. |
| 4,753,569 | A | 6/1988 | Pryor |
| 4,817,017 | A | 3/1989 | Kato |
| 5,103,941 | A | 4/1992 | Vranish |
| 5,155,423 | A | 10/1992 | Karlen et al. |
| 5,220,261 | A | 6/1993 | Kempas |
| 5,293,107 | A | 3/1994 | Akeel |
| 5,341,289 | A | 8/1994 | Lee |
| 5,353,386 | A | 10/1994 | Kasagami et al. |
| 5,495,410 | A | 2/1996 | Graf |
| 5,880,956 | A | 3/1999 | Graf |

(Continued)

FOREIGN PATENT DOCUMENTS

| CN | 103250109 A | 8/2013 |
| DE | 2735632 C2 | 9/1983 |

(Continued)

OTHER PUBLICATIONS

International Preliminary Report on Patentability for PCT/US2015/051917, 12 pages (dated Mar. 28, 2017).

(Continued)

*Primary Examiner* — Farhana A Hoque
(74) *Attorney, Agent, or Firm* — Choate, Hall & Stewart LLP

(57) ABSTRACT

An example gripper may include: a base; two or more fingers attached to the base, with each finger being movable towards, and away from, one or more others of the fingers; and one or more ports at the base or at one or more of the fingers to provide suction through a vacuum.

24 Claims, 11 Drawing Sheets

(56) References Cited

U.S. PATENT DOCUMENTS

| | | | |
|---|---|---|---|
| 6,040,109 A | 3/2000 | Coppens et al. | |
| 6,041,274 A | 3/2000 | Onishi et al. | |
| 6,070,109 A | 5/2000 | McGee et al. | |
| 6,131,296 A | 10/2000 | Fager | |
| 6,292,715 B1 | 9/2001 | Rongo | |
| 6,408,224 B1 | 6/2002 | Okamoto et al. | |
| 6,519,860 B1 | 2/2003 | Bieg et al. | |
| 6,535,794 B1 | 3/2003 | Raab | |
| 6,704,619 B1 | 3/2004 | Coleman et al. | |
| 6,822,412 B1 | 11/2004 | Gan et al. | |
| 6,837,892 B2 | 1/2005 | Shoham | |
| 6,847,922 B1 | 1/2005 | Wampler, II | |
| 6,856,863 B1 | 2/2005 | Sundar | |
| 6,922,610 B2 | 7/2005 | Okamoto et al. | |
| 6,996,456 B2 | 2/2006 | Cordell et al. | |
| 7,248,012 B2 | 7/2007 | Takahashi et al. | |
| 7,272,524 B2 | 9/2007 | Brogardh | |
| 7,278,222 B2 | 10/2007 | Maier et al. | |
| 7,298,385 B2 | 11/2007 | Kazi et al. | |
| 7,300,240 B2 | 11/2007 | Brogardh | |
| 7,571,025 B2 | 8/2009 | Bischoff | |
| 7,643,907 B2 | 1/2010 | Fuhlbrigge et al. | |
| 7,756,608 B2 | 7/2010 | Brogardh | |
| 8,002,716 B2 | 8/2011 | Jacobsen et al. | |
| 8,050,797 B2 | 11/2011 | Lapham | |
| 8,160,205 B2 | 4/2012 | Saracen et al. | |
| 8,255,462 B2 | 8/2012 | Kondo | |
| 8,301,421 B2 | 10/2012 | Bacon et al. | |
| 8,340,820 B2 | 12/2012 | Nair | |
| 8,382,174 B2* | 2/2013 | Desai | B25J 15/0052 294/186 |
| 8,410,732 B2 | 4/2013 | Kassow et al. | |
| 8,457,786 B2 | 6/2013 | Andersson | |
| 8,571,706 B2 | 10/2013 | Zhang et al. | |
| 8,571,711 B2 | 10/2013 | Jacobsen et al. | |
| 8,614,559 B2 | 12/2013 | Kassow et al. | |
| 8,756,973 B2 | 6/2014 | Wallace et al. | |
| 8,774,965 B2 | 7/2014 | Weiss et al. | |
| 8,779,715 B2 | 7/2014 | Kassow et al. | |
| 8,812,155 B2 | 8/2014 | Brethe | |
| 9,248,573 B2 | 2/2016 | Soe-Knudsen et al. | |
| 2002/0013675 A1 | 1/2002 | Knoll et al. | |
| 2003/0120391 A1 | 6/2003 | Saito | |
| 2004/0018631 A1 | 1/2004 | Ward et al. | |
| 2004/0078114 A1 | 4/2004 | Cordell et al. | |
| 2004/0172164 A1 | 9/2004 | Habibi et al. | |
| 2004/0212626 A1 | 10/2004 | Lyxzen et al. | |
| 2005/0080515 A1 | 4/2005 | Watanabe et al. | |
| 2005/0267637 A1 | 12/2005 | Lapham | |
| 2005/0273198 A1 | 12/2005 | Bischoff | |
| 2006/0069466 A1 | 3/2006 | Kato et al. | |
| 2006/0125806 A1 | 6/2006 | Voyles et al. | |
| 2006/0163939 A1 | 7/2006 | Kuramochi et al. | |
| 2006/0178775 A1 | 8/2006 | Zhang et al. | |
| 2008/0004632 A1 | 1/2008 | Sutherland et al. | |
| 2008/0140258 A1 | 6/2008 | Ueno et al. | |
| 2008/0188983 A1 | 8/2008 | Ban et al. | |
| 2008/0188986 A1 | 8/2008 | Hoppe | |
| 2008/0319557 A1 | 12/2008 | Summers et al. | |
| 2009/0076655 A1 | 3/2009 | Blondel et al. | |
| 2009/0157226 A1 | 6/2009 | de Smet | |
| 2009/0259337 A1 | 10/2009 | Harrold et al. | |
| 2009/0289591 A1 | 11/2009 | Kassow et al. | |
| 2010/0241270 A1 | 9/2010 | Eliuk et al. | |
| 2011/0022216 A1 | 1/2011 | Andersson | |
| 2011/0137463 A1* | 6/2011 | Alcazar | B25J 9/1669 700/259 |
| 2012/0191402 A1* | 7/2012 | Filler | G06F 11/263 702/119 |
| 2012/0210817 A1 | 8/2012 | Kassow et al. | |
| 2013/0079928 A1 | 3/2013 | Soe-Knudsen et al. | |
| 2013/0231778 A1 | 9/2013 | Ostergaard | |
| 2013/0255426 A1 | 10/2013 | Kassow et al. | |
| 2014/0062516 A1 | 3/2014 | Rashidzadeh et al. | |
| 2014/0197652 A1* | 7/2014 | Wang | B25J 15/0009 294/185 |

FOREIGN PATENT DOCUMENTS

| | | |
|---|---|---|
| DE | 19858154 A1 | 6/2000 |
| DE | 10048096 A1 | 4/2002 |
| DE | 10157174 A1 | 6/2003 |
| DE | 10239694 A1 | 3/2004 |
| DE | 102006061752 A1 | 7/2008 |
| DE | 102008027008 A1 | 12/2009 |
| EP | 1505464 A2 | 2/2005 |
| EP | 1696289 A1 | 8/2006 |
| EP | 1724676 A1 | 11/2006 |
| EP | 2258521 A1 | 12/2010 |
| EP | 2453325 A1 | 5/2012 |
| EP | 2641136 A1 | 9/2013 |
| EP | 3015932 A1 | 5/2016 |
| ES | 2548037 T3 | 10/2015 |
| JP | H01-146645 A | 6/1989 |
| JP | H02-250782 A | 10/1990 |
| JP | H06-190753 A | 7/1994 |
| JP | 08-257965 A | 10/1996 |
| JP | 08-323676 A | 12/1996 |
| JP | 08323676 A * | 12/1996 |
| JP | H10-254527 A | 9/1998 |
| JP | 2001-050741 A | 2/2001 |
| JP | 2002-120174 A | 4/2002 |
| JP | 2004-49731 A | 2/2004 |
| JP | 2004-148466 A | 5/2004 |
| JP | 2004316722 A | 11/2004 |
| JP | 2005-148789 A | 6/2005 |
| JP | 2005-342885 A | 12/2005 |
| JP | 2008-207263 A | 9/2008 |
| JP | 2010-158754 A | 7/2010 |
| JP | 2014-151371 A | 8/2014 |
| JP | 2014151371 A * | 8/2014 |
| MX | 2013005425 A | 8/2013 |
| RU | 2013125348 A | 12/2014 |
| WO | WO-97/00454 A1 | 1/1997 |
| WO | WO-2004/071717 A1 | 8/2004 |
| WO | WO-2007/099511 A2 | 9/2007 |
| WO | WO-2009/107358 A1 | 9/2009 |
| WO | WO-2012/066025 A1 | 5/2012 |

OTHER PUBLICATIONS

Bennett, D. and Hollerbach, J., Autonomous Calibration of Single-Loop Closed Kinematic Chains Formed by Manipulators with Passive Endpoint Constraints, IEEE Transactions of Robotics and Automation, 7(5):597-606 (1991).

Communication pursuant to Article 94(3) EPC for EP15176362, 4 pages (dated Jan. 5, 2017).

Espacenet, Patent Search, Family List: EP2641136, 2 pages (dated Jun. 5, 2017).

File History for CN201180054670, 70 pages (retrieved Jun. 5, 2017).

File History for EP2453325 48 pages (retrieved Jun. 5, 2017).

File History for EP2641136, 1116 pages, counterpart to U.S. Appl. No. 13/885,233 (retrieved Jun. 5, 2017).

File History for EP3015932, 93 pages (retrieved Jun. 5, 2017).

Final Office Action for U.S. Appl. No. 13/885,233, 32 pages (dated Jan. 10, 2017).

Final Office Action for U.S. Appl. No. 13/885,233, 46 pages (dated Jun. 23, 2017).

Flange, Merriam-Webster definition, 11 pages (retrieved Jun. 7, 2017). URL: http://www.merriamwebster.com/dictionary/flange.

International Preliminary Report on Patentability for PCT/EP2011/070228, 26 pages (dated Feb. 27, 2013).

International Search Report for PCT/EP2011/070228, 3 pages (dated Apr. 24, 2012).

KUKA System Software (KSS), KR C2 / KR C3, Expert Programming, Release 5.2, Version 00, 183 pages (Issued Sep. 26, 2003).

(56) References Cited

OTHER PUBLICATIONS

Maier, C., Aufbau und Einsatz von Industrierobotern, Design and Use of Industrial Robots, Lecture Notes, 3rd Edition, Institute for Production Technology, 11 pages (1996). [English translation unavailable].
Non-Final Office Action for U.S. Appl. No. 13/885,233, 18 pages (dated Jun. 16, 2016).
Non-Final Office Action for U.S. Appl. No. 13/885,233, 29 pages (dated Apr. 11, 2017).
Opposition against European Patent EP 2641136 B1, 27 pages (Jul. 22, 2015).
Robot, Dictionary.com definition, 5 pages (retrieved Jun. 7, 2017). URL: http://www.dictionary.com/browse/robot?s=t,%2520pages%25201-5).
Summons to attend oral proceedings pursuant to Rule 115(1) EPC for EP11784999, 8 pages (Dec. 1, 2016).
Written Opinion of the International Preliminary Examining Authority for PCT/EP2011/070228, 3 pages (dated Oct. 17, 2012).
Written Opinion of the International Searching Authority for PCT/EP2011/070228, 7 pages (dated Apr. 25, 2012).
International Search Report for PCT/US2015/051917, 3 pages (dated Jan. 4, 2016).
Written Opinion for PCT/US2015/051917, 11 pages (dated Jan. 4, 2016).
German Office Action for counterpart German Application No. DE11 2015 003 537.0 with English Translation, 13 pages (dated Aug. 23, 2018).

* cited by examiner

GRASPING GRIPPER

CROSS-REFERENCE TO RELATED APPLICATION

Priority is hereby claimed to U.S. Provisional Application No. 62/056,092, filed on Sep. 26, 2014. The contents of U.S. Provisional Application No. 62/056,092 are incorporated herein by reference.

TECHNICAL FIELD

This specification relates generally to a gripper for use, e.g., with an automated system, such as, but not limited to, a robotic test system.

BACKGROUND

Robot grippers may be custom-developed for specific applications. General purpose robot grippers exist, which mimic the human hand, use jamming technology, or use vacuum pick-up. Mechanical hand-like grippers and jamming grippers may, in some cases, be too large to pick-up small objects. Vacuum pick-up may be limited by the amount of smooth area available on an object and the object's weight.

SUMMARY

An example gripper comprises: a base; two or more fingers attached to the base; and one or more ports located on the base or on at least one of the two or more fingers to provide suction through a vacuum. The example gripper may include one or more of the following features, either alone or in combination.

Each of the two or more fingers may comprise multiple parts interconnected at, and movable about, one or more joints. Each of the two or more fingers may have an inner surface facing one or more others of the fingers and an outer surface facing away from one or more others of the fingers. The one or more ports may be located on inner surfaces of the fingers. The one or more ports may be located on outer surfaces of the fingers. At least one of the two or more fingers may have a tip that can be configured to face away from the base, and at least one of the one or more ports may be located on the tip. At least one of the ports may be on the base.

Each of the two or more fingers may have an inner surface facing others of the fingers, an outer surface facing away from others of the fingers, and a tip that can be configured to face away from the base. For each of the fingers, at least one of the ports may be located on at least two of: the inner surface, the outer surface, and the tip. At least one of the ports may also be on the base.

The gripper may further comprise: one or more vacuum sources to produce vacuum for the one or more ports; and one or more controllers to control the vacuum sources to produce the vacuum. The one or more controllers may be configured (e.g., programmed or designed) to control the one or more vacuum sources to apply vacuum to individual ports independently.

The gripper may comprise a cannula disposed in the base that is extendible from the base, and retractable into the base. A port may be on the cannula (e.g., the tip of the cannula) to provide suction through a vacuum. A cannula may be in at least one of the fingers, that is extendible from the at least one of the fingers, and that is retractable into the at least one of the fingers. A port on the cannula (e.g., on the tip of the cannula) may provide suction through a vacuum. Each finger may be bendable towards, and away from, an interior of the gripper.

Example automatic test equipment (ATE) may comprise: one or more instruments to test a device under test (DUT); and a gripper to grasp the DUT during movement of the DUT relative to an interface to the one or more instruments. The gripper may comprise: a base; two or more fingers attached to the base, with each finger being interconnected at, and movable about, one or more joints; and one or ports at the base or at one or more of the fingers to provide suction through a vacuum.

An example gripper may include: a base; two or more fingers attached to the base, with each finger being movable towards, and away from, one or more others of the fingers; and one or ports at the base or at one or more of the fingers to provide suction through a vacuum. The example gripper may include one or more of the following features, either alone or in combination.

Each of the fingers may have an inner surface facing one or more others of the fingers and an outer surface facing away from one or more others of the fingers. The one or more ports may be located on inner surfaces of the fingers. The one or more ports may be located on outer surfaces of the fingers.

At least one of the fingers may have a tip that is movable to face away from the base, and at least one of the one or more ports may be located on at least one tip. The gripper may also include one or more vacuum sources to produce vacuum for the one or more ports, and one or more controllers to control the vacuum sources independently.

Any two or more of the features described in this specification can be combined to form implementations not specifically described herein.

Automated systems and techniques, with which the implementations described herein may be used, or portions thereof, can be implemented as/controlled by a computer program product that includes instructions that are stored on one or more non-transitory machine-readable storage media, and that are executable on one or more processing devices to control (e.g., coordinate) the operations described herein. The automated systems and techniques including the gripper described herein, or portions thereof, can be implemented in an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Robot grippers, also known as End of Arm Tooling (EOAT) or End Effectors, may be used to pick-up objects for transportation or assembly. For example, in automatic test equipment (ATE), a robot gripper may pick-up a device under test (DUT), and a robotic arm to which the gripper is attached may move the DUT between a loading station and a test slot or test head. At that point, the gripper may let go of the object, and the arm may move the gripper to another device. Grippers may be custom-designed to be specific to the object to be moved. For example, a gripper may be designed, both in structure and size, to pick-up a DUT in ATE.

Although the grippers presented herein are described in the context of testing and ATE, the grippers described herein may be used in any appropriate robotic or automated process, including non-test applications.

A vacuum gripper may employ a vacuum to lift an object. The object being lifted typically has a smooth surface area against which a vacuum is applied. FIGS. 1A, 1B, 1C, and 1D show example vacuum grippers 10, 11, 12, and 13, respectively, that may be used to pick-up small objects like electronic components, or flat objects like small pieces of sheet metal, glass, or paper. In a vacuum gripper, the weight of an object that can be picked-up by a vacuum may be limited by the difference between the vacuum pressure and the ambient atmospheric pressure, divided by the area to which the vacuum can be applied. For example, a 100 gram object at sea level requires a minimum of approximately 0.981 N of force to be lifted. At a nominal sea level atmospheric pressure of 101,325 Pa, a minimum surface area of $0.981/101,325 = 9.68 \times 10-6$ m$^2$ or 9.68 mm$^2$ is required to lift the object with a perfect vacuum and no acceleration. Due to imperfections of vacuums and vacuum seals, large-surface traditional vacuum grippers have limitations. For example, vacuum gripping has heretofore been most applicable to light objects like electronic components, or to objects with large and smooth surface areas like panes of glass. Traditional vacuum grippers are not always well-suited for picking up flexible objects, porous objects, objects with a rough surface, objects with a high aspect ratio, heavy objects with small surface areas, or objects with an unpredictable shape.

A general-purpose mechanical gripper may use a grasping or pinching motion to grab an object. A mechanical gripper uses friction to maintain its grasp on an object. The use of resilient materials, such as rubber, at a contact surface of the mechanical gripper (e.g., the surface that contacts the object to be picked-up) may allow some conformation of the contact surface to the shape of the object to be lifted, increasing friction. A vise gripper is an example of a mechanical gripper.

Figure 1D:
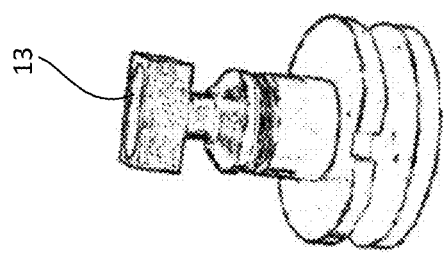
FIGS. 1A, 1B, 1C, and 1D show perspective views of example vacuum grippers.
Figure 1C:
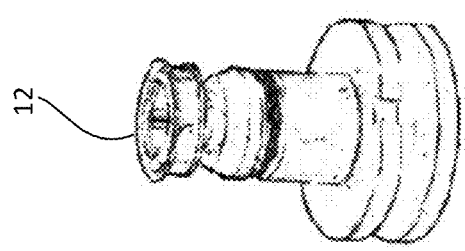
Figure 1B:
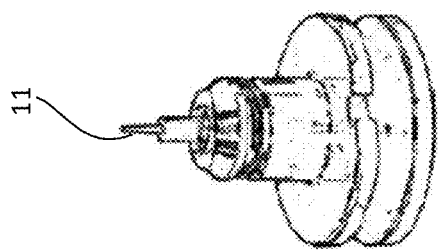
Figure 1A:
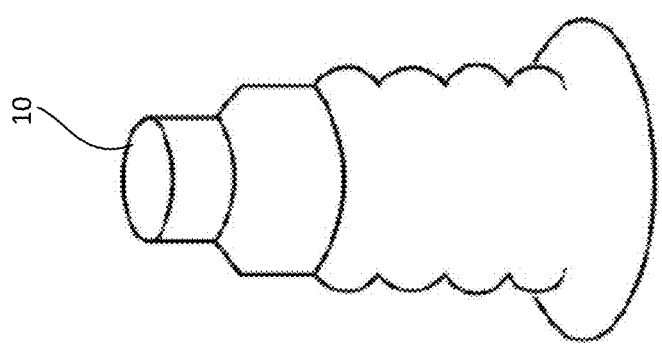
Figure 2:
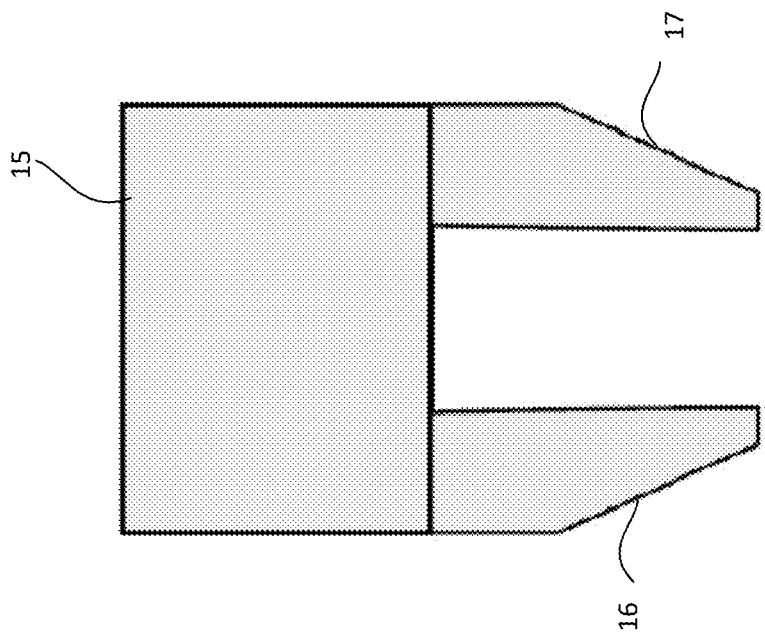
FIG. 2 shows a side view of an example vise gripper.

The vise gripper 15 of FIG. 2 operates like a bench vise. Two movable jaws 16, 17 (or one moveable and one fixed jaw) open and close by electric or pneumatic actuation. The object to be gripped (not shown) fits between the two jaws, and is able to withstand force exerted on its (possibly small) contact area. The type of object that may be gripped may be limited by the amount that the jaws can open and by the degree to which the jaws can fully close (known as the jaws' stroke). A basic vise gripper may not be able to grab objects having insufficient contact area relative to their weight (like a steel ball), objects that may be damaged by the force needed to obtain sufficient friction (like a piece of coral), or low friction objects (like an oily part). And, like a human hand, a vise gripper may have difficulty grasping very thin or delicate objects, or different objects of different sizes. It may be difficult to surround a relatively thin object sufficiently with the tips of the jaws to obtain enough frictional force, especially if the vise gripper is also capable of surrounding very large objects.

Figure 3:
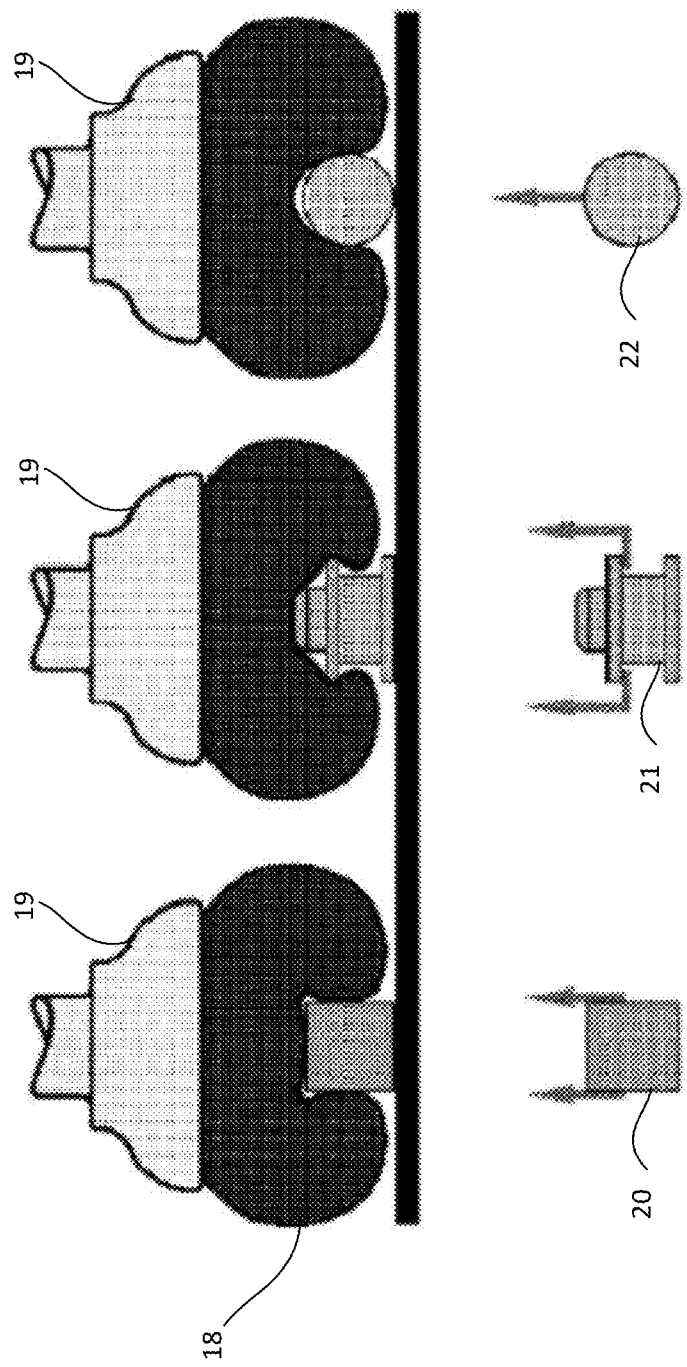
FIG. 3 shows side views of an example jamming gripper operating to grip three different types of objects.

Referring to FIG. 3, a jamming gripper 19 uses a granular substance inside a flexible membrane 18 to pick-up an object. When forced into contact with an object 20, 21, or 22, jamming gripper 19 conforms to the object's size, particularly when the internal granular substance is loosely packed. The granules are jammed by reducing their volume, by applying a vacuum, or by mechanical displacement. The jammed gripper hardens and exerts sufficient force on the side of an object to lift it by friction. The object may also be lifted by wrapping around features on the object, or by creating a region of reduced air pressure above the object.

Jamming grippers may require that the object be thick enough to have a side on which to exert some frictional force, or to have a protrusion that the gripper can mostly surround. Jamming grippers also may require that the object be large in proportion to the granules, so that the granules can flow when not jammed. Jamming grippers also may require that the gripper be significantly wider than the object to be grasped, so that the gripper membrane and granules can surround the object on at least two sides. As such, jamming grippers may not be suitable for picking up relatively small objects (e.g., small screws, small electronic components), objects of different sizes, or flat objects (e.g., sheet metal, paper). Finally, jamming grippers can, in some cases, generate electrostatic discharge (ESD) due to the large volume of air generally used for jamming and unjamming, and the triboelectric transfer of charge between the granules as they rub past each other.

Figure 4:
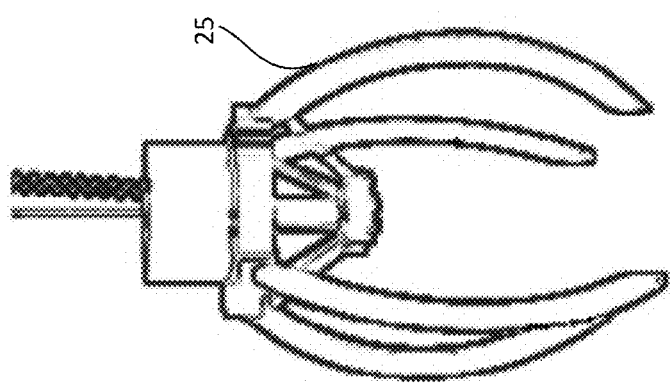
FIG. 4 is a perspective view of an example machine claw.

FIG. 4 shows an example machine claw 25, which is a gripper that may grip using less friction, and that can be used to lift an object by surrounding (and possibly compressing) the object. A sufficiently powerful machine claw can pick-up an object that a vise gripper, such as the one shown in FIG. 3, can pick-up. In addition, such a gripper can pick-up objects that have relatively low friction, or delicate objects, if it is possible to surround the object from underneath. If, however, it is not possible to surround an object, such as a thin piece of metal or a small electronic component, the machine claw may not be able to grasp the object.

The use of resilient materials to increase friction may also be problematic. The materials may wear and need to be replaced. They also can limit the dexterity of a gripper, e.g., a gripper with a resilient pad may not be able to grasp a relatively small or thin object. The part may become embedded (stuck) in the pad, or the pad may deform too much before sufficient friction is obtained to achieve lift.

Figure 5:
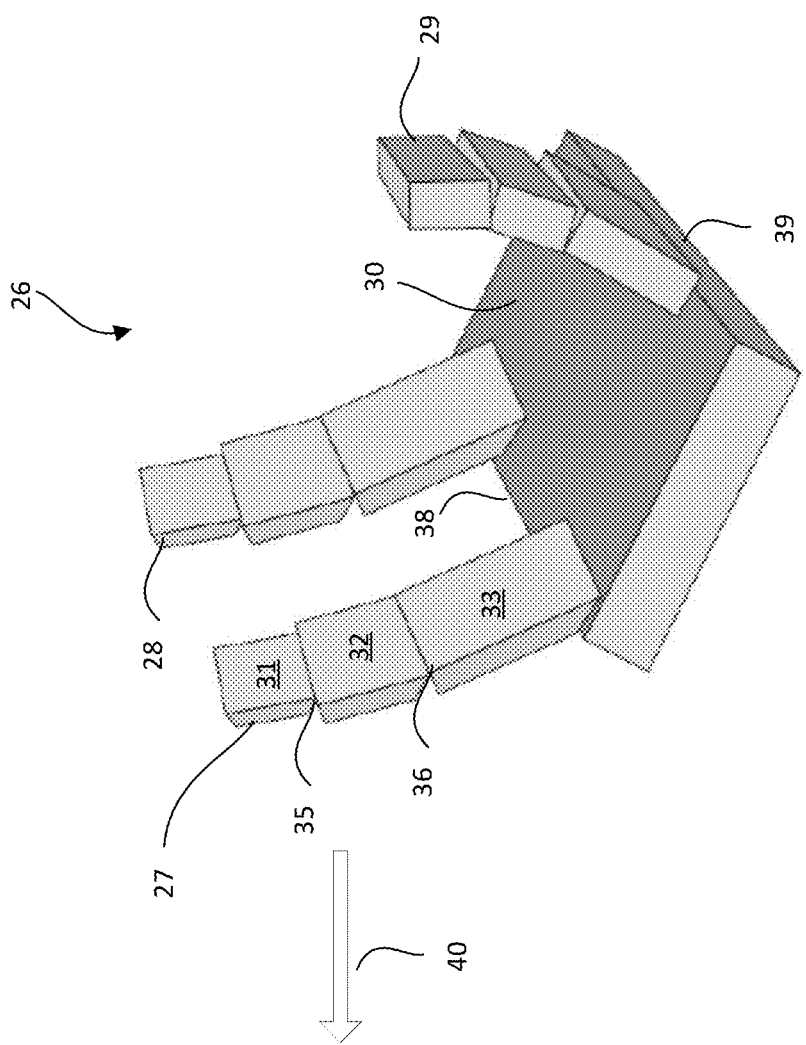
FIG. 5 is a perspective view of an example grasping gripper.

An example grasping gripper 26 is shown in FIG. 5. Grasping gripper 26 is configured to have a structure and function that is based on (and in some cases resembles) the structure and function of a human hand. The example grasping gripper of FIG. 5 has three fingers 27, 28, 29 that act against (e.g., oppose) each other or against a fixed base 30 on which the fingers are mounted. Although only three fingers are shown in FIG. 5, grasping gripper 26 may include any number of two or more such fingers. For example, grasping gripper 26 may include two, three, four, five, six, seven, eight, nine, ten, eleven, twelve, and so forth, number of fingers.

In the example of FIG. 5, each of the fingers includes multiple parts interconnected at, and movable about or around, one or more finger joints. For example, finger 27 includes parts 31, 32, 33. Parts 31 and 32 are connected at joint 35, and parts 32 and 33 are connected at joint 36. In the example of FIG. 5, there are three parts and two joints per finger. However, in some implementations, there may be more, or less, than three parts per finger, and more, or less, than two joints per finger. For example in some implementations, there may be two parts and one joint per finger; there may be four parts and three joints per finger; there may be five parts and four joints per finger; there may be six parts and five joints per finger; there may be seven parts and six joints per finger; there may be eight parts and seven joints per finger; and so forth. In some implementations, each finger may include a single part and no joints, e.g., each finger may be a single rigid part. In some implementations, one or more fingers may be integral parts of the base, and immobile relative to one or more other fingers. For example, a finger may be a rigid structure extending from the base that is opposed by other, moveable fingers. Such a finger may act as a backstop gripping by one or more other, actuated fingers, and may not be actuated itself.

In the example of FIG. 5, each finger has the same number of parts and the same number of joints, resulting in substantially the same configuration for each finger. In some implementations, different fingers may have different numbers of parts and joints, resulting in different configurations for each finger. In some implementations, the grasping gripper may include one or more fingers on a one side 38 of base 30 (two fingers 27, 28 are shown in FIG. 5) and one or more other fingers on another side 39 of base 30 (one finger 29 is shown in FIG. 5). In some implementations, one finger may approximate a human thumb, and oppose all other fingers, although this need not be the case in all implementations. In some implementations, the finger approximating the human thumb may have fewer numbers of parts and joints than the other fingers. For example, the finger approximating the human thumb may have two parts and one joint, whereas the other fingers in such an implementation may each have three parts and two joints (or any other appropriate number of parts and joints).

In the example of FIG. 5, base 30 is rectangular and rigid; however, in other implementations base 30 may have a different shape. For example, base 30 may be square, oval, round, pentagonal, hexagonal, heptagonal, octagonal, or any other shape that is appropriate to hold multiple fingers such as those described herein and, if appropriate, the electronics, hydraulics, pneumatics, or other elements used to control the fingers. In some implementations, such as that show in FIG. 5, the fingers may have the same length or approximately the same length. In some implementations, different fingers may have different lengths. For example, one finger may be longer or shorter than the other fingers; two fingers may be longer or shorter than the other fingers; three fingers may be longer or shorter than the other fingers; four fingers may be longer or shorter than the other fingers; and so forth.

As shown in the example of FIG. 5, the grasping gripper includes two or more fingers acting against (e.g., opposing) each other or against fixed base. That is, in some implementations, the fingers may each move towards each other in a way that is similar to the operation of the human hand. The individual parts may be controllable along the joints to move and to fold inward, towards other fingers, and/or to rotate around a corresponding joint. When working together in this manner, two or more of the fingers may contact, and conform to, the shape of an object to be picked-up and moved. By contacting opposing, or substantially opposing, fingers against an object, frictional force may be generated to grasp and, in some cases, pick-up (or lift) the object. In some implementations, as described below with respect to FIG. 6, vacuum ports may be incorporated into the fingers to expand the range of objects that can be picked-up by the grasping gripper.

Thus, as explained above, the fingers may have a rigid shape, or they may be articulated. The gripper may be actuated electrically, hydraulically, pneumatically, or using any other appropriate mechanism(s). For example, two or more (e.g., all) of the fingers may be controlled individually, or in concert, to generate motion appropriate to grasp, and to pick-up, an object. As described herein, each finger part may be controlled to pivot about and/or rotate around its corresponding joint to implement the movements described herein. In some implementations, each finger part is controllable individually. As noted, in some implementations, control over the parts may be coordinated, as appropriate, to achieve a desired configuration. Control may be implemented via one or computer programs (comprised of instructions/code) that are executable on one or more computers remote to the grasping gripper, or via one or more computer programs that are executable on one or more controllers or other processing devices that resides locally on the grasping gripper itself, on a robotic arm to which the grasping gripper is attached, or on a robot to which the grasping gripper is attached. Control signals from the computer(s) or other processing devices may be sent to the grasping gripper (or parts thereof) via wired or wireless connections or a combination of wired and wireless connections.

In operation, grasping gripper 26 picks-up objects by friction generated between two or more fingers, e.g., by surrounding the object with the fingers and clamping the object. In some implementations, an entire finger or individual part(s) thereof may be bent back, e.g., away from, the base. For example, part 31 may be bent back along the direction of arrow 40 so that part 31 is substantially parallel to base 30, or bent back beyond that position. In some implementations, various parts of the grasping gripper may be controllable to bend back in this manner. For example, each finger may be bent so that it is parallel or substantially parallel to base 30, thereby resembling an open hand with the palm/base exposed.

Figure 6:
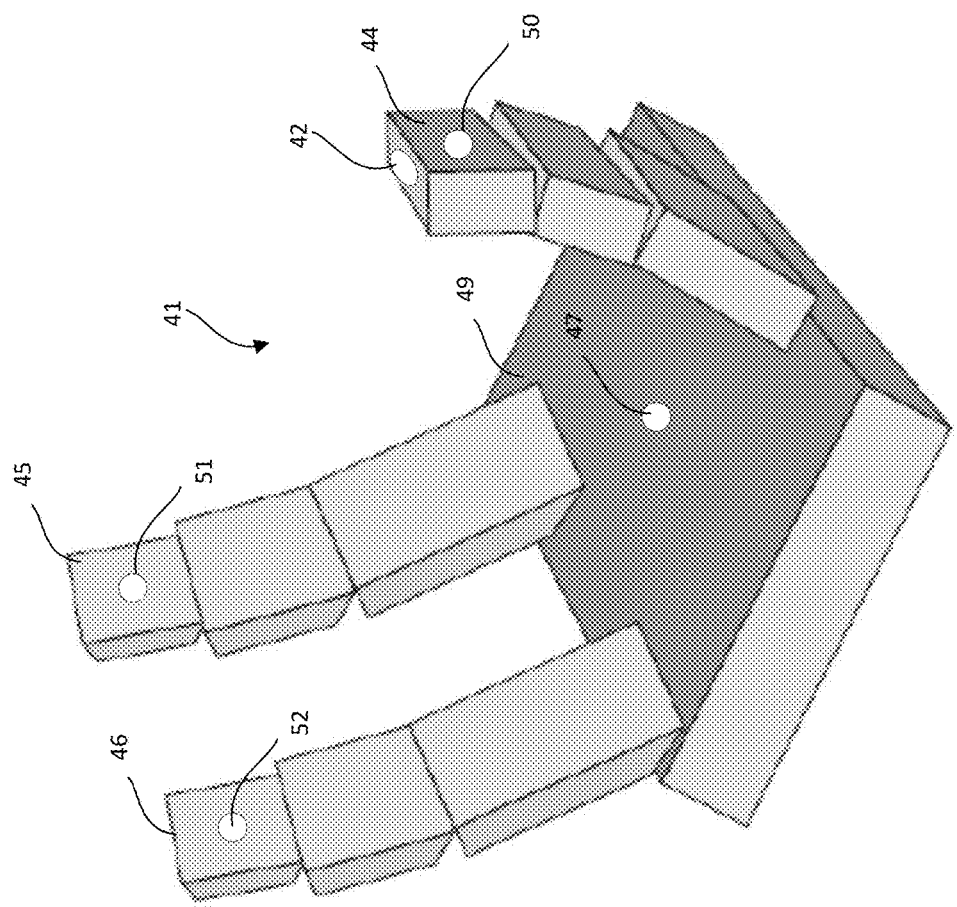
FIG. 6 is a perspective view of an example grasping gripper having vacuum ports on both its fingers and the base.

FIG. 6 shows an example grasping gripper 41 of the type shown in FIG. 5, which incorporates vacuum ports on one or more of the fingers and/or on the base. In this example, the grasping gripper of FIG. 6 includes all of the structure and function of the grasping gripper of FIG. 5, including the different implementations described herein. However, this need not be the case in all implementations.

Figure 7:
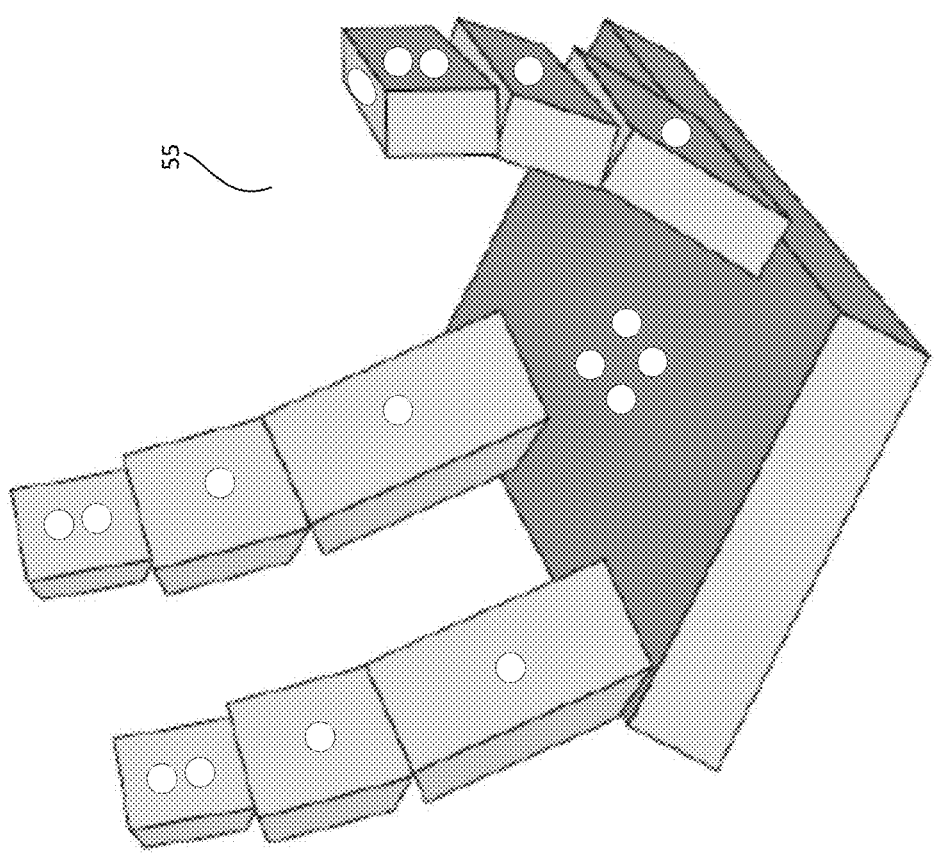
FIG. 7 is a perspective view of an example grasping gripper showing a different number and configuration of vacuum ports than those shown in FIG. 6.

In the example of FIG. 6, one or more vacuum ports are incorporated into the tips of fingers 44, 45, 46 (e.g., example vacuum port 42 is shown), one or more vacuum ports 47 are incorporated into base 49, one or more vacuum ports are incorporated into the backs of the fingers (example vacuum port 50 is shown), one or more vacuum ports are incorporated into one or more (e.g., all) parts of the fingers (examples are shown in FIG. 7), and/or one or more vacuum ports are incorporated into the uppermost pads (the fronts) of the fingers (example vacuum ports 51 and 52 are shown). The vacuum force generated through these vacuum ports can be used to can pick-up objects, either for movement as is, or to subsequently be grasped by the mechanical actuation of the gripper. The amount of vacuum force generated for each port may vary, as appropriate, based on the amount of force required to pick-up an object or to assist in picking-up the object (with the remaining force being generated through gripping achieved by mechanical actuation of the gripper, e.g., by force applied through contact with the fingers).

FIG. 7 shows an implementation of a grasping gripper 55 of the type described herein having vacuum port numbers and configurations different than those shown in FIG. 6. In FIG. 7 each circle represents a vacuum port. The numbers, sizes, shapes, and arrangements of vacuum ports on a grasping gripper may vary, and are not limited to the examples presented herein.

The vacuum force is analogous to a human wetting their finger to generate surface tension to lift an object prior to grasping the object by pressing it against a second finger or the palm of the hand for subsequent movement under higher acceleration. Here, vacuum is used instead of surface tension. In some implementations, subsequent grasp may not be necessary if the object is light enough and the vacuum force is high enough. However, in some implementations, subsequent grasp may be necessary if the object is not light enough and/or the vacuum force is not high enough. The vacuum force may be a function of the size of the object and the grasping force that is applied by the fingers. For example, assuming a same size object, a higher vacuum force is required if no grasping force is used, whereas a lower vacuum force may be used if grasping force is also used. In this regard, the terms "high" and "low" used herein do not have any specific numerical connotations, but rather are used to denote relative size.

By folding several fingers out of the way, a single fingertip vacuum port may be used to selectively lift an object from a confined space, or when surrounded by other objects. In this example, "out of the way" may refer, e.g., to the bending back of a finger away from the finger that is performing the lifting. In this example, vacuum force alone is used to generate sufficient force to pick-up an object; grasping through opposable fingers is not used. In some implementations, as appropriate given the structure of the grasping gripper, different parts of each finger may be operated in this manner to pick-up objects. For example, in some implementations, two or more fingertips may be moved relative to an object to enable the vacuum ports on those fingertips to operate in concert and together generate enough force to lift the object absent grasping force.

When the grasping gripper is used for non-vacuum-assisted grasping, fingertip vacuum ports (e.g., port 42 of FIG. 6) need not be in contact with the grasped object, allowing the ports to have protruding resilient material that may be delicate or large, without obstructing the grasp or wearing the resilient material. The same may not be true of finger pad or base vacuum ports. That is, as described herein, the vacuum force on fronts of one or more parts of the fingers may augment the grasping force achieved through contact between the object and the fingers. In the example of FIG. 6, the front part of each finger has a vacuum port, examples of which are vacuum ports 51 and 52 (the vacuum port on the front part of finger 44 cannot be seen in FIG. 6 due to the angle of that finger). Those parts of the fingers may also be used to grasp an object in this example. Vacuum force generated through the one or more vacuum ports on each front may augment the grasping force, together achieving enough force to lift and move/accelerate an object. The amount of force required to lift an object corresponds to the total force needed; however, the relative amounts of force generated by grasping and the vacuum ports may be controlled as desired based on the ranges of grasping forces that are achievable and the ranges of vacuum force that are achievable.

In some implementations, the fingers can be folded out of the way (rotating so as to be at or beyond the plane of the base). In this configuration, a flat object can be lifted off of a surface via vacuum force generated through the one or more vacuum ports on the base. The fingers may then be folded around the object for subsequent movement under higher acceleration. Thus, much like fingers on a human hand can be extended leaving the open palm free to contact a surface, the fingers of grasping gripper can be controlled so as to allow the base 59, and thus one or more vacuum ports (e.g., 47) on the base, to contact a surface.

Figure 8:
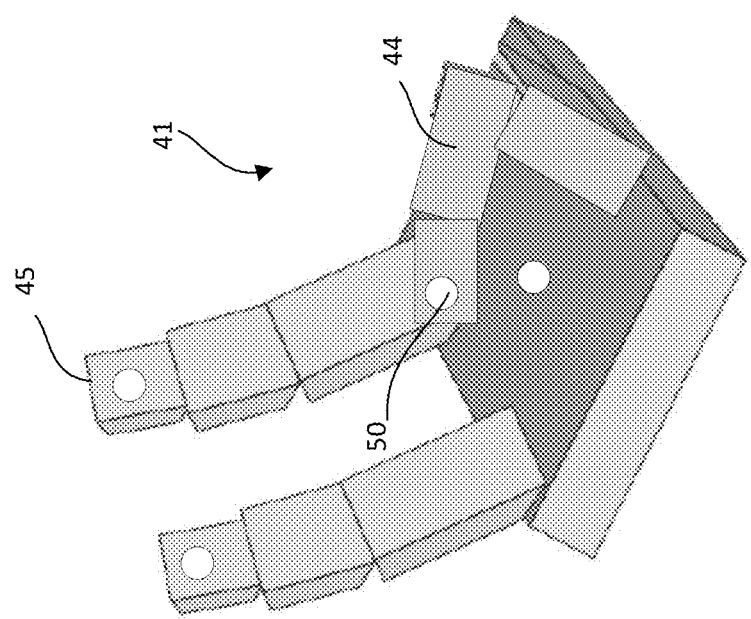
FIG. 8 is a perspective view of an example grasping gripper showing one finger folded to expose a back-side vacuum port.

For standard, non-vacuum-assisted grasping, vacuum ports on the backs of the fingers (e.g., port 50 of finger 44 in FIG. 6) are not contact with the grasped object, allowing the ports to have protruding resilient material that may be delicate or large, without obstructing the grasp or wearing the resilient material. The backs of the fingers may include a cannula that protrudes beyond the body of the finger, to allow greater selectivity in locating an object to pick-up. Objects picked up by the back-of-finger ports may not be graspable by the other fingers, unless an opposite finger is longer, and able to fold over the port. For example, as shown in FIG. 8, finger 44 may fold over, allowing a vacuum port 50 to contact an object and, through appropriate vacuum force, lift the object. If finger 45, for example, has sufficient length to contact the object, grasping force may augment the vacuum force.

Some implementations of the grasping gripper described herein may include one or more of the following features, either alone in combination with the features described elsewhere herein. Some implementations of the grasping gripper described herein may also include one or more features of the grippers shown in FIGS. 1A, 1B, 1C, 1D, FIG. 2, FIG. 3, and/or FIG. 4.

In some implementations, the vacuum ports may be individually actuated, or a single actuation may be performed to control the vacuum force generated through the vacuum ports. For example, all vacuum ports may be connected to a single vacuum source to achieve vacuum force through the ports. The sizes of the ports may influence the amount of vacuum force achieved. In some implementations, different vacuum sources may be connected to the different vacuum ports, thereby allowing different vacuum ports having the same size to generate different vacuum force. Various control methods may be used for shutting off the suction to ports that are not in contact with an object. For example, in the cases of separately controllable vacuum sources, the source(s) to different ports may be shut-off or reduced in suction. In some implementations, including those that use a single vacuum source for example, electro-mechanical switches may be controllable to open or close the vacuum ports individually and independently.

One or more of the vacuum ports may have a cannula that may be selectively extended and retracted, for enhanced selectivity and clearance when extended, and for enhanced protection and flexibility when retracted. The cannula may include a tube or the like, that is extendible, that is hollow, and that includes a port at a tip thereof to enable vacuum force to be created at the end of the cannula. As a result, the cannula can be used in small spaces to pick-up objects using vacuum force, and then retract when not needed. For example, a cannula may be extended from the base of the hand to pick-up a flat object, and then be retracted while carrying the object, as the fingers close around the object. In some implementations, a relatively small cannula may be extended from the tip of a finger to allow greater selectivity without restrictions resulting from finger size in a confined space. Each cannula, and the vacuum force generated therethrough, may be separately and individually controlled via one or more computer programs, as described herein.

Figure 9:
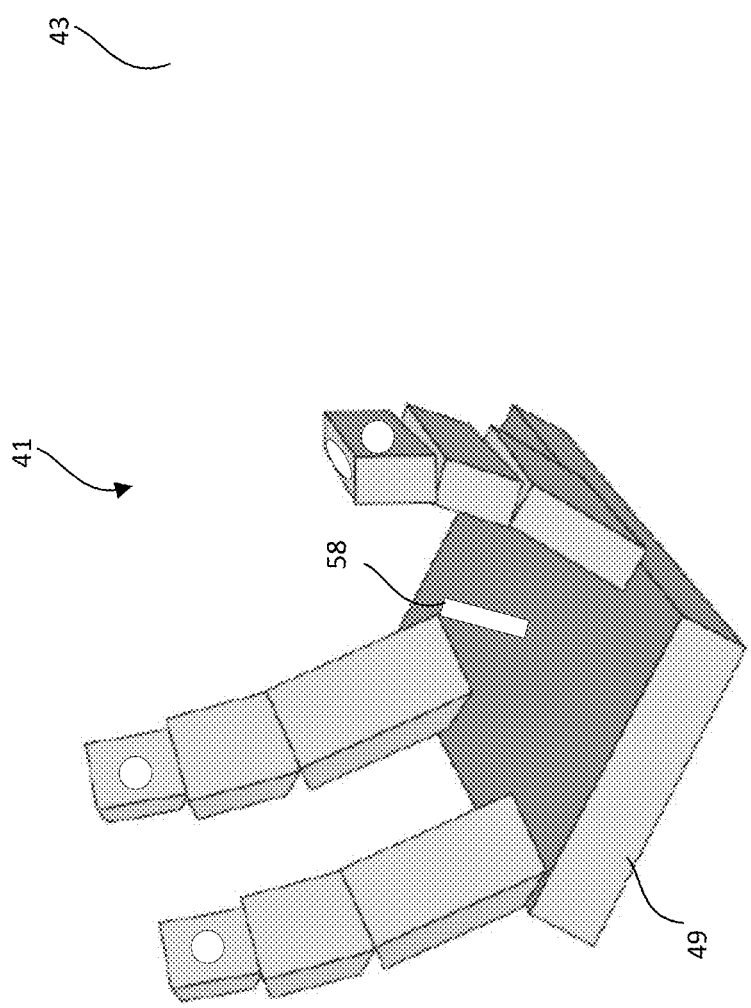
FIG. 9 is a perspective view of an example grasping gripper showing a cannula extending from the base of the grasping gripper.
Figure 10:
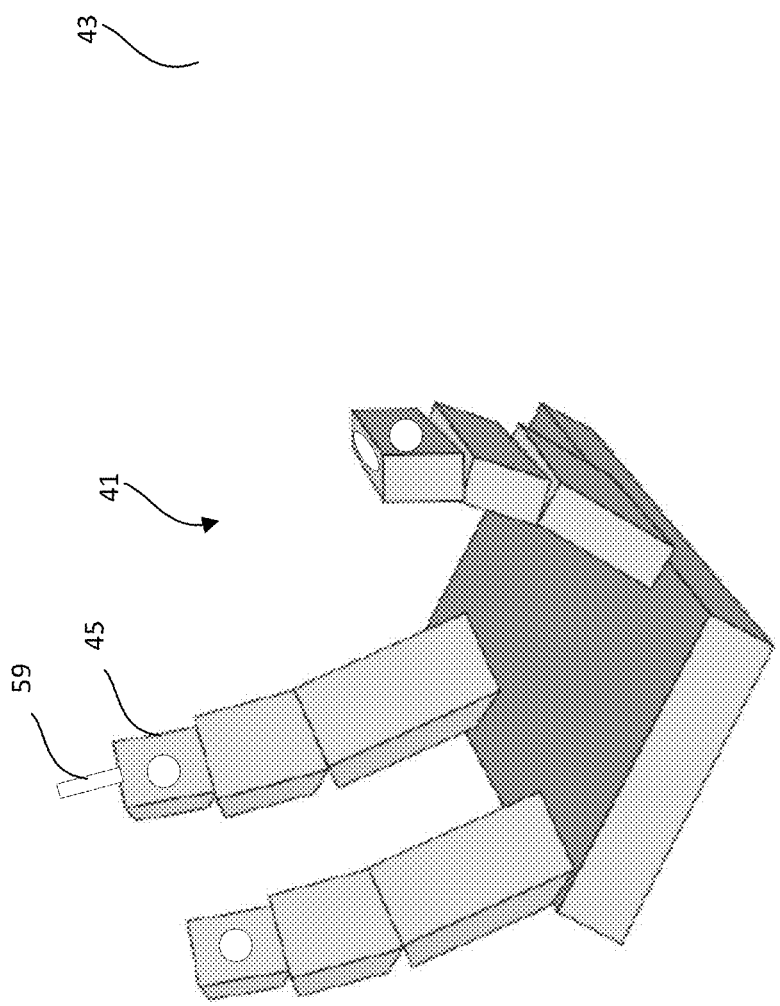
FIG. 10 is a perspective view of an example grasping gripper showing a cannula extending from a fingertip of the grasping gripper.

FIG. 9 shows an example of a cannula 58 extending from base 49 of grasping gripper 41; and FIG. 10 shows an example of a cannula 59 extending from a tip of finger 45. In some implementations, each finger and the base may have an extendible and retractable cannula. In some implementations, an extendible and retractable cannula may be included in only a subset of the fingers or the base. In some implementations, there may be more than one cannula per base or finger.

Different size and shapes of vacuum ports may be used in different parts of the grasping gripper. The sizes and shapes of the vacuum ports may be dependent upon the size of the grasping gripper and on the size of object(s) that the grasping gripper is intended to pick-up. Generally, for the same amount of vacuum suction, a larger port will produce less vacuum force than a smaller port. In this regard, the terms "larger/larger" and "small/smaller" used herein do not have any specific numerical connotations, but rather are used to denote relative size.

The vacuum ports described herein, and associated features, may also be incorporated into a vise-type gripper, such as that shown in FIG. 2. For example, vacuum ports may be incorporated into the sides of vise-type gripper 15 (FIG. 2). As such, that gripper may be used to hold small objects by vacuum alone or, if appropriate, by a combination of vacuum force and grasping force. In some implementations, vacuum ports of the type described herein, and their associated features, may be incorporated into any of the grippers shown in FIGS. 1A, 1B, 1C, 1D, FIG. 2, FIG. 3, and/or FIG. 4, as appropriate.

In some implementations, a single grasping gripper of the type described herein is capable of lifting large objects (e.g., a standard-sized brick), small objects (e.g., a 0603 resistor), porous objects (e.g., a square of cotton cloth), irregular and delicate objects (e.g., a piece of coral), and/or thin objects (e.g., a 100×50 mm piece of 0.15 mm thick aluminum). Grasping grippers having different sizes and shapes may be usable to lift different sized and shaped objects.

Figure 11:
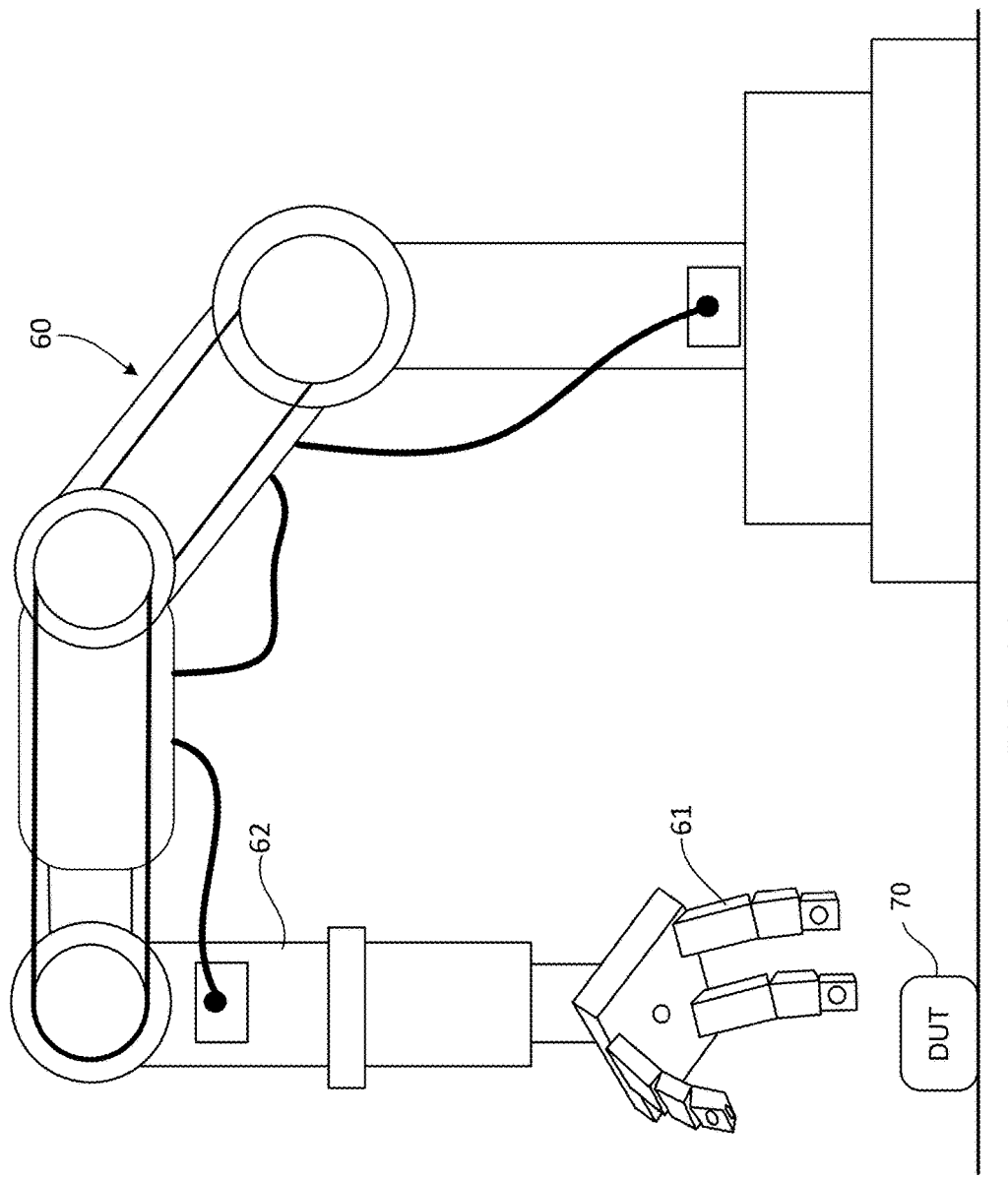
FIG. 11 is a perspective view of an example robot in a test system that employs a grasping gripper of the type described herein.

The grasping gripper described herein can be used in any appropriate factory or warehouse applications including, but not limited to, test applications, such as automatic test equipment (ATE) used to test various components that need to be grabbed and moved. FIG. 11 shows an example a robot 60 that is part of a test system (e.g., ATE) that includes a grasping gripper 61 of the type described herein (e.g., of the type shown in FIGS. 5 to 10).

Devices tested by such ATE may include any appropriate semiconductor or other testable device that can be contacted and lifted by the grasping gripper described herein. The devices may include, but are not limited to, devices at the integrated circuit (IC) package level, which may be used in various applications, such as solid state drives. A solid-state drive (SSD) is a data storage device that uses solid-state memory to store persistent data. The grasping gripper described herein may be used to lift a device to be tested by the system, as described herein.

Referring to FIG. 11, robot 60 includes a robotic arms, such as arm 62, and a grasping gripper 61 disposed at a distal end of the robotic arm. The robotic arm and gripper are controllable to lift a DUT 70 that has not been tested, and to transport the DUT to a test station, test rack, or other appropriate testing facility. The robot arm and gripper are also controllable to remove a device that has already been tested from the test station, test rack, or other appropriate testing facility.

In some implementations, the test system also includes at least one computer in communication with robot 60. The computer may include one or more processing devices (e.g., multiple computers or devices) and may be configured to provide inventory control of the devices under test and/or an automation interface to control the device test system, including robot 60. Test electronics that are part of the test system may include one or more processing devices to execute test processes and monitor the status (e.g., temperature, performance, etc.) of the devices under test.

The example grippers described herein, or automated systems that use those grippers, may be controlled using hardware or a combination of hardware and software. For example, a system that includes the gripper described herein may include various controllers and/or processing devices located at various points. A central computer may coordinate operation among the various controllers or processing devices. The central computer, controllers, and processing devices may execute various software routines to effect control and coordination of system operation.

System, including gripper, operations can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals (including wireless signals) to flow between connected components. Any appropriate "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A gripper comprising:
a base;
two or more fingers attached to the base, each of the two or more fingers being configured to move inward towards at least one other of the two or more fingers to enable grasping of an object by the two or more fingers; and
one or more ports located on a pad of at least one of the fingers facing at least one other finger to grasp the object, the one or more ports to provide suction on the pad to aid the two or more fingers in grasping the object;
wherein suction through the one or more ports is controllable based, at least in part, on a grasping force produced by the at least one finger and the at least one other finger.

2. The gripper of claim 1, wherein each of the two or more fingers comprises multiple parts interconnected at, and movable about, one or more joints.

3. The gripper of claim 1, wherein each of the two or more fingers has an inner surface facing one or more others of the fingers and an outer surface facing away from one or more others of the fingers; and
wherein one or more ports are located on tips of the fingers.

4. The gripper of claim 1, wherein each of the two or more fingers has an inner surface facing one or more others of the fingers and an outer surface facing away from one or more others of the fingers; and
wherein one or more ports are located on outer surfaces of the fingers.

5. The gripper of claim 1, wherein at least one of the two or more fingers has a tip that can be configured to face away from the base;
wherein at least one of the one or more ports is located on the tip.

6. The gripper of claim 3, 4, or 5, wherein at least one port is on the base.

7. The gripper of claim 1, wherein each of the two or more fingers has an inner surface facing others of the fingers, the inner surface comprising a pad, an outer surface facing away from others of the fingers, and a tip that can be configured to face away from the base; and
wherein, for each of the fingers, at least one port is located on at least two of: the inner surface, the outer surface, and the tip.

8. The gripper of claim 7, wherein at least one port is also on the base.

9. The gripper of claim 1, further comprising:
one or more vacuum sources to produce vacuum for the one or more ports; and
one or more controllers to control the vacuum sources to produce the vacuum.

10. The gripper of claim 9, wherein the one or more controllers are configured to control the one or more vacuum sources to apply vacuum to individual ports independently.

11. The gripper of claim 1, further comprising a cannula disposed in the base that is extendible from the base, and retractable into the base.

12. The gripper of claim 11, further comprising:
a port on the cannula to provide suction through a vacuum.

13. The gripper of claim 12, wherein the port is on a tip of the cannula.

14. The gripper of claim 1, further comprising a cannula in at least one of the fingers, the cannula being extendible from the at least one of the fingers, and the cannula being retractable into the at least one of the fingers.

15. The gripper of claim 14, further comprising:
a port on the cannula to provide suction through a vacuum.

16. The gripper of claim 15, wherein the port is on a tip of the cannula.

17. The gripper of claim 1, wherein each finger is bendable towards, and away from, an interior of the gripper.

18. Automatic test equipment (ATE) comprising:
one or more instruments to test a device under test (DUT); and
a gripper to grasp the DUT during movement of the DUT relative to an interface to the one or more instruments, the gripper comprising:
a base;
two or more fingers attached to the base, each of the two or more fingers being interconnected at, and movable about, one or more joints, each of the two or more fingers being configured to move inward towards at least one other of the two or more fingers to enable grasping of an object by the two or more fingers; and
one or more ports on one or more pads of the fingers, each finger facing at least one other finger to grasp the object, each port to provide suction on a pad to aid the two or more fingers in holding the object;
wherein suction through the one or more ports is controllable based, at least in part, on a grasping force produced by at least one finger and the at least one other finger.

19. The ATE of claim 18, wherein the object is the DUT.

20. A gripper comprising:
a base;

fingers attached to the base, each finger being movable towards, and away from, one or more others of the fingers to produce force to grasp an object;

one or more cannulas disposed on, and extendible from, a tip of one or more corresponding ones of the fingers; and a port on at least one of the one or more cannulas, the port to provide suction through a vacuum.

21. The gripper of claim 20, wherein each of the fingers has an inner surface facing one or more others of the fingers and an outer surface facing away from one or more others of the fingers; and wherein one or more ports are located on inner surfaces of the fingers.

22. The gripper of claim 20, wherein each of the fingers has an inner surface facing one or more others of the fingers and an outer surface facing away from one or more others of the fingers; and wherein one or more ports are located on outer surfaces of the fingers.

23. The gripper of claim 20, wherein at least one of the fingers has a tip that is movable to face away from the base; wherein at least port is located on at least one tip.

24. The gripper of claim 20, further comprising:

one or more vacuum sources to produce vacuum for one or more ports; and one or more controllers to control the vacuum sources independently.

* * * * *